(12) United States Patent
Liao

(10) Patent No.: US 11,605,925 B2
(45) Date of Patent: Mar. 14, 2023

(54) POWER ADAPTER

(71) Applicant: GUANGDONG GOPOD GROUP HOLDING CO., LTD., Shenzhen (CN)

(72) Inventor: Zhuowen Liao, Shenzhen (CN)

(73) Assignee: Guangdong Gopod Group Holding Co., Ltd., Shenzhen (CN)

( * ) Notice: Subject to any disclaimer, the term of this patent is extended or adjusted under 35 U.S.C. 154(b) by 0 days.

(21) Appl. No.: 16/760,404

(22) PCT Filed: Mar. 18, 2020

(86) PCT No.: PCT/CN2020/079928
§ 371 (c)(1),
(2) Date: Apr. 29, 2020

(87) PCT Pub. No.: WO2021/184243
PCT Pub. Date: Sep. 23, 2021

(65) Prior Publication Data
US 2022/0416489 A1    Dec. 29, 2022

(51) Int. Cl.
*H01R 31/06* (2006.01)
*H01R 13/66* (2006.01)
(Continued)

(52) U.S. Cl.
CPC ......... *H01R 31/065* (2013.01); *H01R 13/665* (2013.01); *H01R 24/60* (2013.01); *H01R 24/68* (2013.01); *H05K 7/209* (2013.01)

(58) Field of Classification Search
CPC .... H01R 31/065; H01R 13/665; H01R 24/60; H01R 24/68
(Continued)

(56) References Cited

U.S. PATENT DOCUMENTS 6,411,514 B1 * 6/2002 Hussaini ............... H05K 7/209
361/689
7,118,399 B1 * 10/2006 Wen ....................... H01R 27/00
439/166

(Continued)

FOREIGN PATENT DOCUMENTS

CN       107147276 A    9/2017
CN       209913720 U    1/2020

OTHER PUBLICATIONS

U.S. Appl. No. 16/760,408, filed Apr. 29, 2020, Liao.

*Primary Examiner* — Alexander Gilman
(74) *Attorney, Agent, or Firm* — Wolf, Greenfield & Sacks, P.C.

(57) ABSTRACT

A power adapter includes a housing, an electronic assembly and a protective assembly. The housing has a receiving cavity, and the housing is provided with at least one heat dissipation hole penetrating to the receiving cavity. The electronic assembly comprises a plurality of electronic elements located in the receiving cavity. The protective assembly comprises a connection portion connected to an outer wall of the housing and extending outward, and a protective portion connected to an extension end of the connection portion, the protective portion is spaced apart from the housing. The projection of the protective portion toward the housing covers the heat dissipation hole. The protective portion of the power adapter may shield the heat dissipation hole to prevent external dust from falling into the receiving cavity through the heat dissipation hole. Heat dissipated by the electronic assembly may be dissipated out through the heat dissipation hole.

14 Claims, 3 Drawing Sheets

(51) Int. Cl.
    *H01R 24/60*   (2011.01)
    *H01R 24/68*   (2011.01)
    *H05K 7/20*    (2006.01)

(58) Field of Classification Search
    USPC .......................................................... 439/131
    See application file for complete search history.

(56)                   References Cited

U.S. PATENT DOCUMENTS

| | | |
|---|---|---|
| 7,978,489 B1 | 7/2011 | Telefus et al. |
| 8,790,124 B2 | 7/2014 | Lee et al. |
| 9,728,906 B2 | 8/2017 | Colahan et al. |
| 11,317,544 B1* | 4/2022 | Zeng ........................ H02K 1/20 |
| 2004/0144527 A1* | 7/2004 | Yang .................... H05K 5/0247 |
| | | 165/185 |
| 2014/0308853 A1 | 10/2014 | Colahan et al. |
| 2016/0276783 A1 | 9/2016 | Colahan et al. |
| 2018/0013229 A1* | 1/2018 | Goulden ................ H01R 24/60 |
| 2019/0341714 A1* | 11/2019 | Du .......................... H04L 69/08 |
| 2020/0021065 A1* | 1/2020 | Chu .................... H01R 13/5213 |
| 2020/0235538 A1* | 7/2020 | Liao ........................ H01R 31/02 |
| 2020/0244021 A1* | 7/2020 | Liao ....................... H01R 31/065 |
| 2021/0265849 A1* | 8/2021 | Liao .......................... H02J 7/02 |
| 2022/0173561 A1* | 6/2022 | Jang ..................... H01R 13/533 |
| 2022/0256733 A1* | 8/2022 | Wu .................... H05K 7/20909 |
| 2022/0263329 A1* | 8/2022 | Wei .................... H01R 13/6205 |
| 2022/0360034 A1* | 11/2022 | Liao ........................ H01R 13/02 |
| 2022/0416489 A1 | 12/2022 | Liao |
| 2022/0416490 A1 | 12/2022 | Liao |

* cited by examiner

POWER ADAPTER

RELATED APPLICATION(S)

This application is a 371 National Stage application of International Application No. PCT/CN2020/079,928, filed Mar. 18, 2020, The aforementioned application is incorporated herein by reference, in its entirety, for any purposes.

TECHNICAL FIELD

The present application belongs to the technical field of charging devices, and particularly relates to a power adapter.

BACKGROUND OF THE INVENTION

The power adapter is a power supply conversion device for a small portable electronic device and an electronic appliance; a variety of electronic elements are provided in a shell of the power adapter, and during use, these electronic elements will generate heat; and in order to solve this problem, it is common on the market that the power adapter is filled with a heat dissipation adhesive inside a housing to absorb heat of other electronic means in the housing, but for a smaller power adapter in volume, the heat of the electronic elements is relatively concentrated, the heat dissipation efficiency of the heat dissipation adhesive is slow, and the heat dissipation effect is not good, which affects the safety performance of the product.

SUMMARY OF THE INVENTION

Technical Problem

An object of the present application is to provide a power adapter, which aims to solve the technical problems of the power adapter in the prior art, such as relatively concentrated heat, a slow heat dissipation efficiency and a poor heat dissipation effect.

Solution to Problem

Technical Solution

The present application is implemented by a power adapter, which comprises:

a housing having a receiving cavity, the housing being provided with at least one heat dissipation hole penetrating to the receiving cavity;

an electronic assembly comprising a plurality of electronic elements located in the receiving cavity; and a protective assembly comprising a connection portion connected to an outer wall of the housing and extending outward, and a protective portion connected to an extension end of the connection portion, wherein the protective portion is spaced apart from the housing, and the projection of the protective portion toward the housing covers the heat dissipation hole.

In one of the embodiments, a groove is formed on the outer wall of the housing, and the heat dissipation hole is formed at a groove bottom of the groove.

In one of the embodiments, the housing comprises a main body portion and a heat dissipation portion, the main body portion is cylindrical, the heat dissipation portion is connected to an edge of the main body portion and extends circumferentially along the edge, the heat dissipation hole is formed in the heat dissipation portion, the connection portion is connected to the heat dissipation portion, a plurality of the heat dissipation holes are provided, the plurality of the heat dissipation holes are arranged at intervals along an extension direction of the heat dissipation portion, the connection portion has a ring shape adapted to the heat dissipation portion, and the protective portion has a ring shape adapted to the connection portion.

In one of the embodiments, the housing further comprises a light transmitting portion provided between the main body portion and the heat dissipation portion, the light transmitting portion is a light transmitting portion made of a light transmitting material, the power adapter further comprises a light emitting assembly disposed in the receiving cavity, the light emitting assembly comprises at least one lamp bead connected to the housing, and the light transmitting portion is used to transmit light emitted by the lamp bead.

In one of the embodiments, the light emitting assembly further comprises a light emitting circuit board electrically connected to the electronic assembly, and a plurality of the lamp beads are electrically connected to the light emitting circuit board.

In one of the embodiments, the light transmitting portion is connected to an edge of the main body portion and extends circumferentially along the edge, the heat dissipation portion is connected to the light transmitting portion, a plurality of the lamp beads are provided, and the plurality of the lamp beads are arranged at intervals along an extension direction of the light transmitting portion.

In one of the embodiments, the receiving cavity has an opening, the protective assembly further comprises a top cover portion covering the opening, and the connection portion surrounds an edge of the top cover portion.

In one of the embodiments, the electronic assembly comprises a control circuit board located in the receiving cavity and an interface socket connected to the control circuit board, the top cover portion is provided with an interface hole, and the interface socket directly faces the interface hole.

In one of the embodiments, the interface socket includes at least one of a USB-Type-C interface socket, a USB-Type-B interface socket, a TF card interface socket, an audio interface socket, and an HDMI interface socket.

In one of the embodiments, the power adapter further comprises a plug connected to the housing and electrically connected to the control circuit board.

In one of the embodiments, the plug is rotatably connected to the housing.

In one of the embodiments, the housing is provided with an avoidance groove, and the plug can be accommodated in the avoidance groove by means of rotation.

In one of the embodiments, the electronic assembly further comprises a transformer located in the receiving cavity, the transformer and the electronic element are both integrated in the control circuit board, and the plug is electrically connected to the transformer.

In one of the embodiments, the housing is further provided with a plug hole penetrating to the receiving cavity, the electronic assembly further comprises a plug socket for plugging of a power connector, and the plug socket is electrically connected to the transformer.

In one of the embodiments, the power adapter further comprises a heat dissipation adhesive connected to the light emitting assembly and the electronic assembly, and the heat dissipation adhesive has thermal conductivity and is capable of conducting heat of the light emitting assembly to the heat dissipation hole.

Beneficial Effects of the Invention

Beneficial Effects

A technical effect of the present application relative to the prior art is that the power adapter is provided with a heat dissipation hole, so that the heat dissipated by the electronic assembly inside the receiving cavity can be dissipated outward through the heat dissipation hole to achieve a fast and efficient heat dissipation effect, thus avoiding heat accumulation in the receiving cavity, and improving the use safety of the product; and the projection of the protective portion toward the heat dissipation portion covers the heat dissipation hole and the protective portion is spaced apart from the housing, that is, the protective portion can shield the heat dissipation hole, and a heat dissipation passage is formed between the protective portion and the heat dissipation portion and the main body portion, which not only does not hinder the heat dissipation hole from dissipating heat, but also prevents external dust and debris from falling into the receiving cavity through the heat dissipation hole.

BRIEF DESCRIPTION OF THE DRAWINGS

In order to explain the technical solutions of the embodiments of the present application more clearly, the drawings used in the embodiments of the present application or the description of the prior art will be briefly introduced below. Obviously, the drawings described below are only some embodiments of the present application, and for those of ordinary skill in the art, other drawings can be obtained based on these drawings without involving any inventive effort.

DESCRIPTION OF REFERENCE NUMERALS

Figure 1:
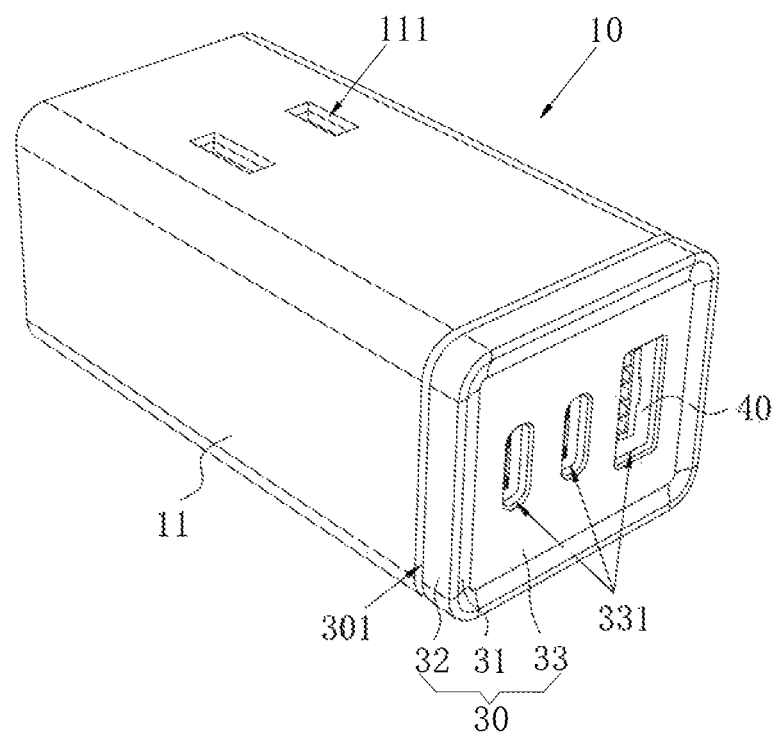
FIG. 1 is a perspective structural view of a power adapter provided by an embodiment of the present application from one perspective.

10. Housing; 11. Main body portion; 101. Receiving cavity; 111. Plug hole; 112. Avoidance groove; 12. Light transmitting portion. 13. Heat dissipation portion; 131. Heat dissipation hole; 14. Bottom cover; 20. Light emitting assembly, 21. Lamp bead; 22. Light emitting circuit board; 30. Protective assembly; 301. Groove; 31. Connection portion; 32. Protective portion; 33. Top cover portion; 331. Interface hole; 40. Interface socket; 50. Plug; 60. Control circuit board; 70. Plug socket; 80. Electronic element

DETAILED DESCRIPTION OF EMBODIMENTS

Examples of the Present Invention

Embodiments of the present application will be described below in detail, and examples of the embodiments are shown in the drawings, wherein the same or similar reference numerals represent the same or similar elements or elements having the same or similar functions throughout. The embodiments described below with reference to the accompanying drawings are exemplary and are intended to be illustrative of the present application, and will not be interpreted as limiting the present application.

In the description of the present application, it should be understood that the orientations or positional relationships indicated by the terms "inside", "outside", etc. are based on the orientations or positional relationships shown in the drawings, and are only for the convenience of describing the present application and simplifying the description, rather than indicating or implying that device or element referred to must have a specific orientation or be constructed and operated in a specific orientation, and therefore cannot be construed as limiting the present application.

In the description of the present application, the meaning of "a plurality of" is two or more, unless otherwise explicitly and specifically defined.

In the present application, unless otherwise explicitly specified and limited, the terms such as "mount", "connect with", "connect" and "fix" should be broadly understood, for example, they can be a fixed connection or a detachable connection or be integrated; can be a mechanical connection or an electrical connection; and can be directly connected with each other, or can be indirectly connected with each other through an intermediate medium, and can be communication between interiors of two elements or interaction between two elements. For those of ordinary skill in the art, the specific meanings of the above terms in the present application can be understood according to specific situations.

In order to make the object, technical solutions, and advantages of the present application clearer, the present application is described in further detail below with reference to the drawings and embodiments.

Figure 3:
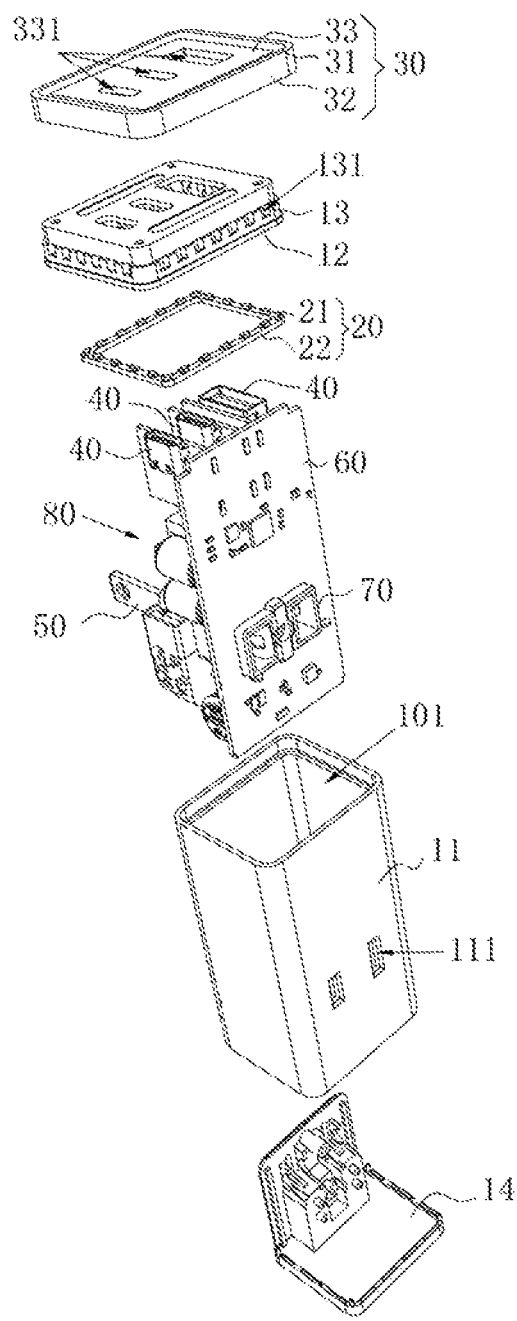
FIG. 3 is an exploded view of a power adapter provided by an embodiment of the present application.

Please refer to FIGS. 1 and 3, the present application provides a power adapter, which comprises a housing 10, an electronic assembly, a light emitting assembly 20, a protective assembly 30, a heat dissipation adhesive, and a plug 50. Wherein the electronic assembly comprises a control circuit board 60, a plug socket 70, an interface socket 40, and an electronic element 80.

Please refer to FIG. 3, the protective assembly 30 together with the housing 10 encloses a receiving cavity 101, and the light emitting assembly 20, the electronic assembly and the heat dissipation adhesive are all located in the receiving cavity 101. The housing 10 comprises a bottom cover 14, a main body portion 11, a light transmitting portion 12 and a heat dissipation portion 13 which are successively connected, and the main body portion 11, the light transmitting portion 12 and the heat dissipation portion 13 can collectively enclose a cylindrical shape. Wherein the main body portion 11 may be cylindrical, and the cross section of the main body portion 11 may be circular, oval, polygonal, etc. In this embodiment, the cross section of the main body portion 11 is rectangular. Both the light transmitting portion 12 and the heat dissipation portion 13 may be in the shape of a strip, and at this time, the light transmitting portion 12 and the heat dissipation portion 13 may be embedded in the main body portion 11. In this embodiment, please further refer to FIG. 4, the bottom cover 14 covers one end of the main body portion 11, the light transmitting portion 12 is connected to the other end of the main body portion 11 and extends circumferentially along the edge of the main body portion 11 to increase the light transmitting area. The heat dissipation portion 13 is in the shape of a ring or a cover, and when in the shape of a ring, the heat dissipation portion is connected to the side of the light transmitting portion 12 facing away from the main body portion 11 and extends circumferentially along the edge of the light transmitting portion 12 to adapt to the edge of the light transmitting portion 12. The light transmitting portion 12 is made of a light transmitting material, preferably a transparent material to facilitate light projection. The heat dissipation portion 13 is provided with at least one heat dissipation hole 131, and in this embodiment, a plurality of heat dissipation holes 131 are provided and the plurality of heat dissipation holes 131 are arranged at intervals along an extension direction of the heat dissipation portion 13, so as to improve the heat dissipation efficiency and ensure support strength of the heat dissipation portion 13. Wherein the heat dissipation portion 13 and the light transmitting portion 12 may both be made of a thermally conductive material to absorb heat in the receiving cavity 101 and improve the heat dissipation efficiency.

Figure 4:
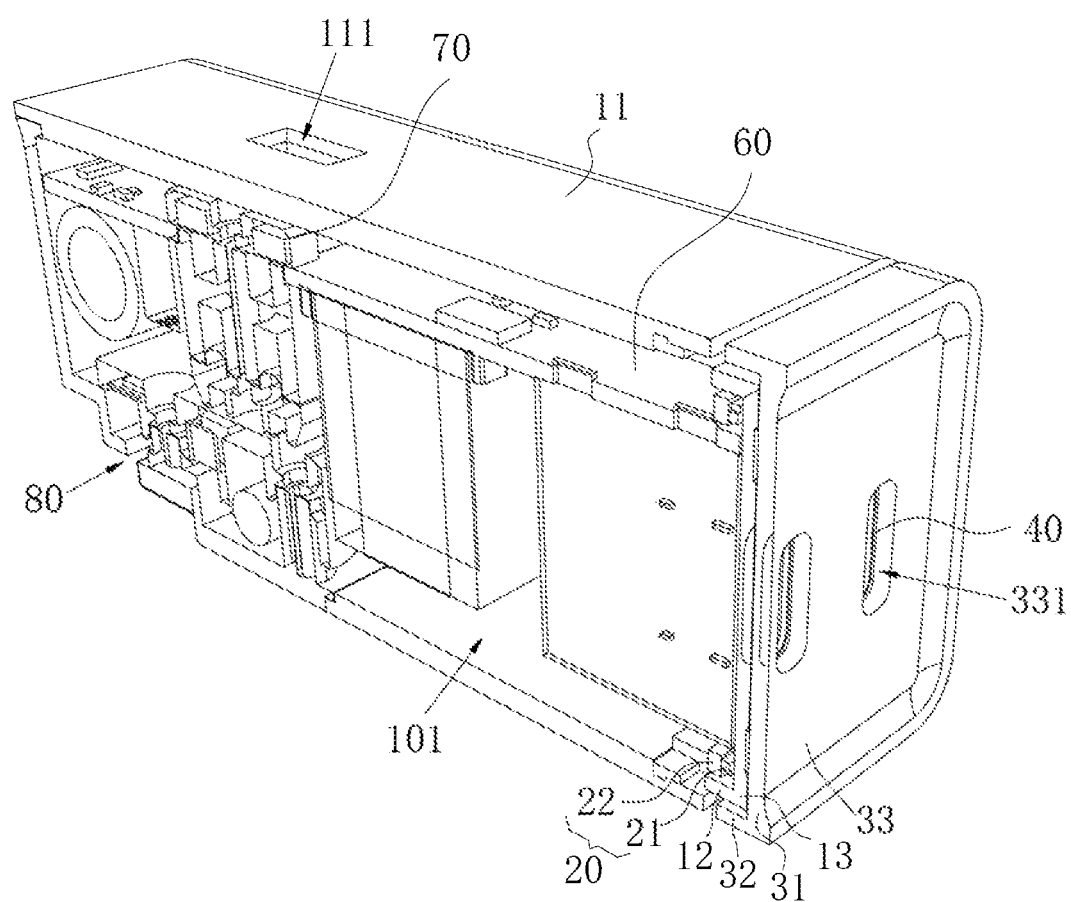
FIG. 4 is a sectional view of a power adapter provided by an embodiment of the present application.

Please refer to FIGS. 3 and 4, the light emitting assembly 20 comprises a light emitting circuit board 22 electrically connected to the control circuit board 60, and at least one lamp bead 21 connected to the light emitting circuit board 22; and the light emitting assembly 20 is located inside the receiving cavity 101 and connected to the main body portion 11 via the control circuit board 60. The light transmitting portion 12 covers the lamp bead 21, and can transmit light emitted by the lamp bead 21 and can also make the light emitted by the lamp bead 21 softer, avoiding irritating the eyes of a user in a dim environment, and also protecting the lamp bead 21. The light emitting circuit board 22 is used to control the lamp bead 21 to emit light. The lamp bead 21 is preferably an LED lamp bead 21. In order to improve the lighting effect, a plurality of lamp beads 21 are provided, and the plurality of lamp beads 21 are arranged at intervals along an extension direction of the light transmitting portion 12.

Please refer to FIGS. 3 and 4, the protective assembly 30 comprises a connection portion 31 connected to the heat dissipation portion 13 and extending outward, a protective portion 32 connected to the connection portion 31 and directly facing the heat dissipation hole 131, and a top cover portion 33 connected to the connection portion 31; the protective portion 32 is spaced apart from the heat dissipation portion 13; and the projection of the protective portion 32 toward the heat dissipation portion 13 covers the heat dissipation hole 131. Specifically, the cross section of the protective assembly 30 is L-shaped. Preferably, the connection portion 31 has a ring shape adapted to the heat dissipation portion 13, and the protective portion 32 has a ring shape adapted to the connection portion 31 so as to circumferentially protect the heat dissipation hole 131. The receiving cavity 101 has an opening, the top cover portion 33 covers the opening, the connection portion 31 surrounds an edge of the top cover portion 33, the top cover portion 33 protects the receiving cavity 101, the top cover portion 33 may be provided with electronic means, and the user can see the position and type of the electronic means through the lighting effect of the light emitting assembly 20.

The light emitted by the lamp beads 21 of the power adapter can be projected out through the light transmitting portion 12 made of a light transmitting material, and the heat dissipation portion 13 is provided with the heat dissipation hole 131, so that the heat dissipated by the electronic assembly inside the receiving cavity 101 can be dissipated outward through the heat dissipation hole 111 to achieve a fast and efficient heat dissipation effect, thus avoiding heat accumulation in the receiving cavity 101, and improving the use safety of the product; and the projection of the protective portion 32 toward the heat dissipation portion 13 covers the heat dissipation hole 131 and the protective portion is spaced apart from the housing 10, that is, the protective portion 32 can shield the heat dissipation hole 131, and a heat dissipation passage is formed between the protective portion and the heat dissipation portion 13 and the main body portion 11, which not only does not hinder the heat dissipation hole 111 from dissipating heat, but also prevents external dust and debris from falling into the receiving cavity 101 through the heat dissipation hole 111. In this embodiment, please refer to FIGS. 2 and 4, a groove 301 is formed on an outer wall of the housing 10, that is, the main body portion 11, the light transmitting portion 12, the heat dissipation portion 13 and the connection portion 31 collectively enclose the groove 301; a groove wall of the groove 301 is the main body portion 11 and the connection portion 31, respectively, and a groove bottom is the light transmitting portion 12 and the heat dissipation portion 13; the protective portion 32 is accommodated in the groove 301 and extends toward the main body portion 11, is spaced apart from the groove bottom and the main body 11, and encloses a heat dissipation passage together with the heat dissipation portion 13, the light transmitting portion 12, and the main body portion 11; and the heat dissipated by the light emitting assembly 20 can be dissipated from the receiving cavity 101 through the heat dissipation hole 131 and the heat dissipation passage, which makes the heat dissipation efficiency more efficient than directly dissipating heat through the housing 10. Preferably, an outer wall surface of the main body portion 11 and an outer wall surface of the protective portion 32 are located on the same plane, so as to improve the aesthetics and usage comfort of the power adapter and prevent corners of the protective portion 32 from scratching the user.

Please refer to FIG. 3, the interface socket 40 is connected to the top cover and is electrically connected to the control circuit board 60, the top cover portion 33 is provided with an interface hole 331, and the interface socket 40 directly faces the interface hole 331. A connector of an external data cable can interface with the interface socket 40 through the interface hole 331. Wherein the interface socket 40 includes at least one of a USB-Type-C interface socket 40, a USB-Type-B interface socket 40, a TF card interface socket 40, an audio interface socket 40, and an HDMI interface socket 40 to improve diversification of function of the power adapter. One or a plurality of interface sockets 40 may be provided, and the plurality of interface sockets 40 may be of the same type or different types. In this embodiment, the interface socket 40 is provided in any three of the above types.

In order to improve the heat dissipation efficiency of the power adapter, the light emitting assembly 20 is connected with the heat dissipation adhesive, the heat dissipation adhesive extends to the heat dissipation hole 131, and the heat dissipation adhesive has thermal conductivity and can absorb heat of a heat dissipation assembly and conduct the heat to the heat dissipation hole 131, so that the heat is dissipated from the heat dissipation hole 131. Preferably, the heat dissipation adhesive can also absorb the heat of other electronic elements 80 in the receiving cavity 101 that can generate heat, so as to accelerate the cooling speed of the electronic means.

Figure 2:
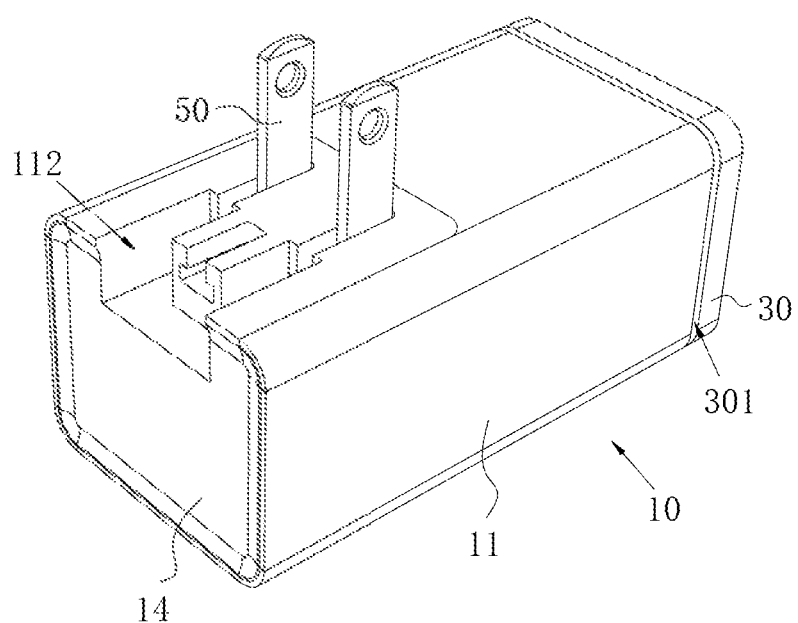
FIG. 2 is a perspective structural view of a power adapter provided by an embodiment of the present application from another perspective.

Please refer to FIG. 2, the plug 50 is connected to the housing 10 and is electrically connected to the control circuit board 60. Preferably, the plug 50 is connected to the main body portion 11. The plug 50 is used to be plugged into an external socket. For easy storage, the plug 50 is rotatably connected to the main body portion 11.

Please refer to FIG. 2, preferably, the main body portion 11 is provided with an avoidance groove 112, and the plug 50 can be accommodated in the avoidance groove 112 by means of rotation. As such, when the plug 50 is not in use, it can be stored in the avoidance groove 112 to prevent external bumping or accidental opening, and when it is needed to be used, the plug 50 is rotated out of the avoidance groove 112 to achieve the plug function.

The electronic assembly in the receiving cavity 101 further comprises a capacitor, an inductor, a control chip, etc., which are all electrically connected to the control circuit board 60; and the transformer is electrically connected to the plug 50, and is used to convert external strong AC current introduced by the plug 50 into weak DC current for use in a small electronic device.

Please refer to FIGS. 1 and 3, the main body portion 11 is further provided with a plug hole 111 penetrating to the receiving cavity 101, the plug socket 70 is connected to the main body portion 11 and is electrically connected to the transformer, the plug socket 70 and the plug hole 111 are oppositely arranged, and the external plug 50 can be plugged into the plug socket 70 through the plug hole 111, at this time, the power adapter functions to transfer. Wherein the plug socket 70 may be a plug socket 70 that complies with British Standard, European Standard or American Standard.

The above embodiments are merely preferred embodiments of the present application, only the technical principles of the present application are specifically described, and these descriptions are only for explaining the principles of the present application and cannot be interpreted in any way as limiting the scope of protection of the present application. Based on the explanation herein, any modifications, equivalent replacements, and improvements made within the spirit and principles of the present application, and other specific implementations of the present application conceived by those skilled in the art without involving any inventive effort should be included within the scope of protection of the present application.

The invention claimed is:

1. A power adapter comprising:
a housing having a receiving cavity, the housing being provided, with at least one heat dissipation hole penetrating to the receiving cavity;
an electronic assembly comprising a plurality of electronic elements located in the receiving cavity; and
a protective assembly comprising a connection portion connected to an outer wall of the housing and extending outward, and a protective portion connected to an extension end of the connection portion, wherein the protective portion is spaced apart from the housing, and a projection of the protective portion toward the housing covers the heat dissipation hole;
wherein the housing comprises a main body portion and a heat dissipation portion, the main body portion is cylindrical, the heat dissipation portion is connected to an edge of the main body portion and extends circumferentially along the edge, the heat dissipation hole is formed in the heat dissipation portion, the connection portion is connected to the heat dissipation portion, a plurality of the heat dissipation holes are provided, the plurality of the heat dissipation holes are arranged at intervals along an extension direction of the heat dissipation portion, the connection portion has a ring shape adapted to the heat dissipation portion, and the protective portion has a ring shape adapted to the connection portion.

2. The power adapter of claim 1, wherein a groove is formed on the outer wall of the housing, and the heat dissipation hole is formed at a groove bottom.

3. The power adapter of claim 1, wherein the housing further comprises a light transmitting portion provided between the main body portion and the heat dissipation portion, the light transmitting portion is a light transmitting portion made of a light transmitting material, the power adapter further comprises a light emitting assembly disposed in the receiving cavity, the light emitting assembly comprises at least one lamp bead connected to the housing, and the light transmitting portion is used to transmit light emitted by the lamp bead.

4. The power adapter of claim 3, wherein the light emitting assembly further comprises a light emitting circuit board electrically connected to the electronic assembly, and a plurality of the lamp beads are electrically connected to the light emitting circuit board.

5. The power adapter of claim 3, wherein the light transmitting portion is connected to an edge of the main body portion and extends circumferentially along the edge, the heat dissipation portion is connected to the light transmitting portion, a plurality of the lamp beads are provided, and the plurality of the lamp heads are arranged at intervals along an extension direction of the light transmitting portion.

6. The power adapter of claim 3, wherein the power adapter further comprises a heat dissipation adhesive connected to the light emitting assembly and the electronic assembly, and the heat dissipation adhesive has thermal conductivity and is capable of conducting heat of the light emitting assembly to the heat dissipation hole.

7. A power adapter, comprising:
a housing comprising a receiving cavity having an opening, the housing being provided, with at least one heat dissipation hole penetrating to the receiving cavity;
an electronic assembly comprising a plurality of electronic elements located in the receiving cavity; and
a protective assembly comprising:
a top cover portion covering the opening,
a connection portion connected to an outer wall of the housing and extending outward, the connection portion surrounding an edge of the top cover portion, and
a protective portion connected to an extension end of the connection portion, wherein the protective portion is spaced apart from the housing, and a projection of the protective portion toward the housing covers the heat dissipation hole.

8. The power adapter of claim 7, wherein the electronic assembly comprises a control circuit board located in the receiving cavity and an interface socket connected to the control circuit board, the top cover portion is provided with an interface hole, and the interface socket directly faces the interface hole.

9. The power adapter of claim 8, wherein the interface socket includes at least one of a USB-Type-C interface socket, a USB-Type-B interface socket, a TF card interface socket, an audio interface socket, and an HDMI interface socket.

10. The power adapter of claim 8, wherein the power adapter further comprises a plug connected to the housing and electrically connected to the control circuit board.

11. The power adapter of claim 10, wherein the plug is rotatably connected to the housing.

12. The power adapter of claim 11, wherein the housing is provided with an avoidance groove, and the plug can be accommodated in the avoidance groove by means of rotation.

13. The power adapter of claim 10, wherein the electronic assembly further comprises a transformer located in the receiving cavity, the transformer and the electronic element are both integrated in the control circuit board, and the plug is electrically connected to the transformer.

14. The power adapter of claim 13, wherein the housing is further provided with a plug hole penetrating to the receiving cavity, the electronic assembly further comprises a plug socket for plugging of a power connector, and the plug socket is electrically connected to the transformer.

* * * * *